(12) United States Patent
Yabe (10) Patent No.: US 10,560,077 B2
(45) Date of Patent: Feb. 11, 2020

(54) CR OSCILLATOR

(71) Applicant: TOSHIBA MEMORY CORPORATION, Minato-ku (JP)

(72) Inventor: Hiroo Yabe, Nerima (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/907,325

(22) Filed: Feb. 28, 2018

(65) Prior Publication Data

US 2019/0068175 A1   Feb. 28, 2019

(30) Foreign Application Priority Data

Aug. 30, 2017   (JP) .................. 2017-165858

(51) Int. Cl.
    *H03K 3/26*     (2006.01)
    *H03K 4/50*     (2006.01)
    *H03K 19/20*     (2006.01)

(52) U.S. Cl.
    CPC .............. *H03K 4/50* (2013.01); *H03K 19/20* (2013.01)

(58) Field of Classification Search
    CPC ............. H03K 4/50; H03K 3/03; H03K 19/20
    USPC .................. 331/111, 137, 140, 143
    See application file for complete search history.

(56) References Cited

U.S. PATENT DOCUMENTS

| | | | | |
|---|---|---|---|---|
| 3,914,711 A | * | 10/1975 | Carlson .................. | H03K 3/027 331/108 D |
| 4,616,173 A | * | 10/1986 | Cook ..................... | G01R 23/10 324/76.16 |
| 5,491,456 A | * | 2/1996 | Kay ........................ | H03K 3/011 331/143 |

FOREIGN PATENT DOCUMENTS

| | | | |
|---|---|---|---|
| JP | 60-163524 | * | 8/1985 |
| JP | 62-258513 | | 11/1987 |
| JP | 9-64701 | | 3/1997 |
| JP | 4854964 | | 1/2012 |

* cited by examiner

*Primary Examiner* — Richard Tan (74) *Attorney, Agent, or Firm* — Oblon, McClelland, Maier & Neustadt, L.L.P.

(57) ABSTRACT

A CR oscillator has a first logic inversion unit including odd-number stages of logic inversion elements connected in series, a second logic inversion unit including odd-number stages of logic inversion elements connected in series, the second logic inversion unit being connected to a latter stage of the first logic inversion unit, and two or more resistors and a capacitor connected in series between an output node of the first logic inversion unit and an output node of the second logic inversion unit. An electric potential in accordance with an electric potential of an intermediate node between the two or more resistors is supplied to an input node of the first logic inversion unit.

10 Claims, 5 Drawing Sheets

FIG. 9

CR OSCILLATOR

CROSS REFERENCE TO RELATED APPLICATIONS

This application is based upon and claims the benefit of priority from the prior Japanese Patent Application No. 2017-165858, filed on Aug. 30, 2017, the entire contents of which are incorporated herein by reference.

FIELD

Embodiments relate to a CR oscillator.

BACKGROUND

A CR oscillator is known, in which, among series-connected two-stage inverters, a resistor and a capacitor are connected between input node and output node of the latter-stage inverter, and a connection node of the resistor and the capacitor is connected to an input node of the former-stage inverter.

This type of CR oscillator is unique in excellent responsiveness even having a simple circuit configuration. However, since an input voltage of the first-stage inverter instantaneously becomes a high voltage that exceeds a power supply voltage, the former-stage inverter is required to withstand high voltages. Nevertheless, a high-voltage withstanding inverter has a longer propagation delay time than a regular inverter, and hence has a problem of reduction in oscillation frequency.

As explained above, the known CR oscillator configured with a plurality of stages of inverters, a resistor, and a capacitor can basically control the oscillation frequency based on a resistance value of the resistor and capacitance of the capacitor. However, since the first-stage inverter is required to withstand high voltages, the oscillation frequency is restricted by a propagation delay time of the first-stage inverter.

DETAILED DESCRIPTION

A CR oscillator according to one embodiment has a first logic inversion unit including odd-number stages of logic inversion elements connected in series, a second logic inversion unit including odd-number stages of logic inversion elements connected in series, the second logic inversion unit being connected to a latter stage of the first logic inversion unit, and two or more resistors and a capacitor connected in series between an output node of the first logic inversion unit and an output node of the second logic inversion unit. An electric potential in accordance with an electric potential of an intermediate node between the two or more resistors is supplied to an input node of the first logic inversion unit.

Embodiments will now be explained with reference to accompanying drawings. In the present specification and the accompanying drawings, for easy understanding and convenience in drawing, explanation, and drawings are made with part of configuration being omitted, modified, or simplified. However, the technical contents to the degree that the same function can be expected, are interpreted as being included in the embodiments.

(First Embodiment)

Figure 1:
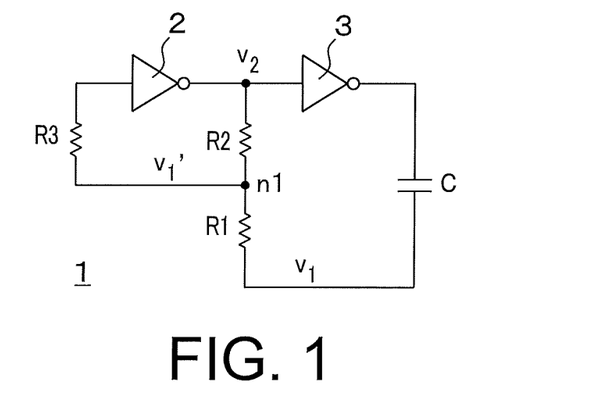
FIG. 1 is a circuit diagram of a CR oscillator according to a first embodiment.

FIG. 1 is a circuit diagram of a CR oscillator 1 according to a first embodiment. The CR oscillator 1 of FIG. 1 is provided with a first logic inversion unit 2, a second logic inversion unit 3, two or more resistors R1 and R2, and a capacitor C.

The first logic inversion unit 2 and the second logic inversion unit 3 each are configured with odd-number stage logic inversion elements connected to each other in series. FIG. 1 shows an example of the first logic inversion unit 2 and the second logic inversion unit 3 each configured with one inverter. FIG. 1 is just an example. At least one of the first logic inversion unit 2 and the second logic inversion unit 3 may be configured with three or more odd numbers of inverters. Moreover, a logic element in the first logic inversion unit 2 and the second logic inversion unit 3 may not always be limited to the inverter, which may be logic gate such as an NAND gate or a NOR gate to substantially function like the inverter by fixing the logic of one of input nodes of the logic gate.

In the CR oscillator 1 of FIG. 1, between an output node of the first logic inversion unit 2 and an output node of the second logic inversion unit 3, two or more resistors R1 and R2, and a capacitor C are connected to one another in series. An electric potential in accordance with an electric potential of an intermediate node n1 between the two or more resistors R1 and R2 is applied to an input node of the first logic inversion unit 2. In FIG. 1, although a resistor R3 is connected between the intermediate node and the input node of the first logic inversion unit 2, the resistor R3 is a protection resistor and hence may be omitted. The presence or absence of the protection resistor does not affect an oscillation frequency of the CR oscillator 1 of FIG. 1

In FIG. 1, although there are series-connected two resistors R1 and R2 as the two or more resistors R1 and R2, series-connected three or more resistors may be provided. It is denoted in the present specification that the resistor R1 has a resistance value R1 and the resistor R2 has a resistance value R2, with a resistance ratio of R1:R2=1:X (X>1) between the resistors R1 and R2. In other words, the resistance value of the resistor R2 is larger than that of the resistor R1. It is denoted in FIG. 1 that a connection node of the capacitor C and the resistor R1 has an electric potential $v_1$, a connection node n1 of the resistors R1 and R2 has an electric potential $v_1'$, and a connection node of the first and second logic inversion units 2 and 3 has an electric potential $v_2$. It is noted that a connection node is a node included in an intermediate node.

Figure 2:
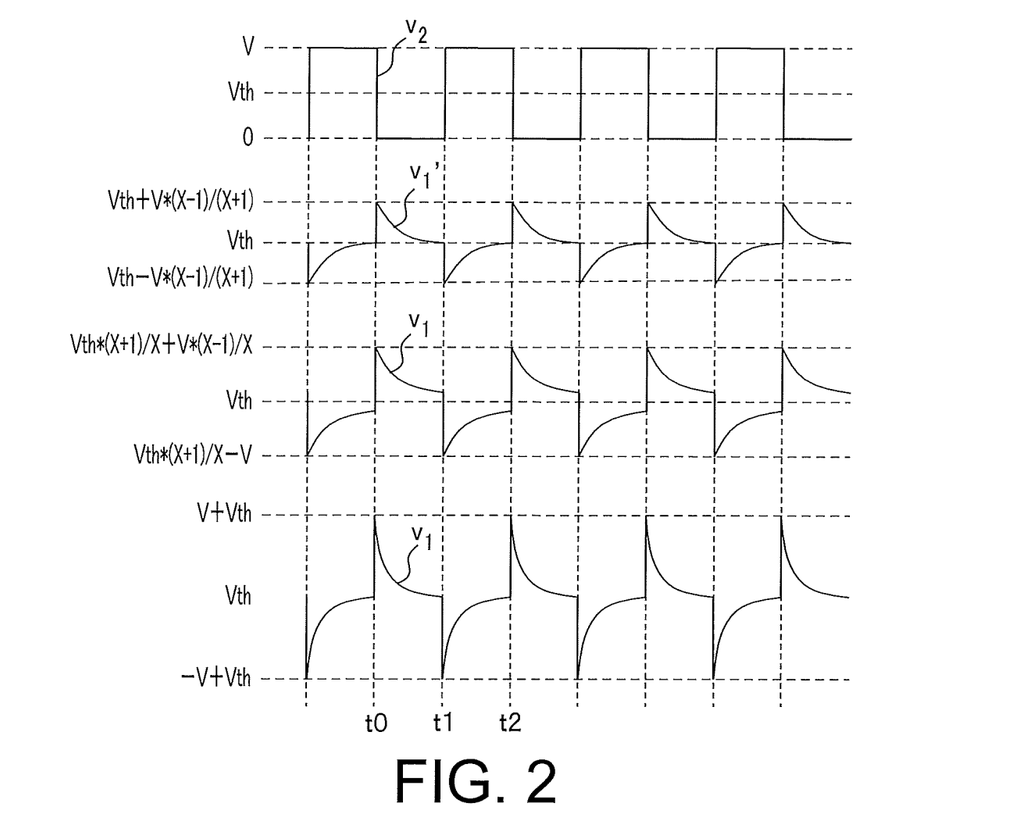
FIG. 2 is an electric-potential waveform diagram at input node and output node of a first logic inversion unit of FIG. 1.

FIG. 2 is an electric-potential waveform diagram at the input node and the output node of the first logic inversion unit 2 of FIG. 1. It is defined in FIG. 2 that the first and second logic inversion units 2 and 3 have a power-supply electric potential V and a ground electric potential 0. As shown in FIG. 2, the input-node electric potential $v_1'$ of the first logic inversion unit 2 of FIG. 1, which corresponds to the electric potential of the intermediate node n1, has an electric potential waveform that is equal to or lower than the power-supply electric potential V but equal to or higher than the ground electric potential. The output-node electric potential $v_2$ of the first logic inversion unit 2, which corresponds to the electric potential of the connection node of the first and second logic inversion units 2 and 3, has a rectangular waveform. The lower-most waveform of FIG. 2 is an electric potential waveform of a CR oscillator 1 of a first comparative example, which will be described later.

Figure 3A:
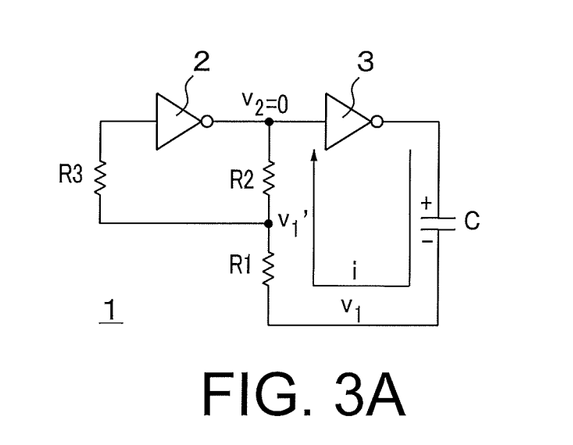
FIG. 3A is a diagram with an arrow indicating a direction of a current flowing through a CR oscillator during time period from time t0 to t1 of FIG. 2.

FIG. 3A is a diagram with an arrow indicating a direction of a current i flowing through the CR oscillator 1 during time period from time t0 to t1 of FIG. 2. During the time period from time t0 to t1, a charge current flows from an output node of the second logic inversion unit 3 to the capacitor C. The input-node electric potential of the first logic inversion unit 2 gradually decreases as charging to the capacitor C proceeds. When the input-node electric potential of the first logic inversion unit 2 becomes lower, at time t1, than a threshold voltage $V_{th}$ of the first logic inversion unit 2, the output-node electric potential $v_2$ of the first logic inversion unit 2 rapidly increases.

Figure 3B:
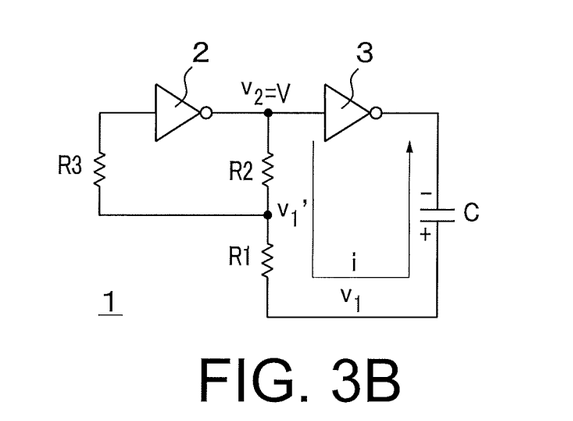
FIG. 3B is a diagram with an arrow indicating a direction of a current flowing through a CR oscillator during time period from time t1 to t2 of FIG. 2.

FIG. 3B is a diagram with an arrow indicating a direction of a current i flowing through the CR oscillator 1 during time period from time t1 to t2 of FIG. 2. During the time period from time t1 to t2, the first logic inversion unit 2 is high at its output node and the second logic inversion unit 3 is low at its output node. Therefore, current i flows in a direction from the resistor R2→the resistor R1→the capacitor C, which is the reverse direction of that indicated in FIG. 3A to charge the capacitor C. As the charging to the capacitor C proceeds, the electric potential $v_1'$ of the input node of the first logic inversion unit 2 gradually increases, the input node being the intermediate node of the resistors R1 and R2. At time t2, when the input-node electric potential $v_1'$ of the first logic inversion unit 2 exceeds the threshold voltage $V_{th}$ of the first logic inversion unit 2, the output-node electric potential $v_2$ of the first logic inversion unit 2 rapidly decreases. Thereafter, the operation in the same manner as that in the time period from time t0 to t1 shown in FIG. 3A is performed.

Figure 4:
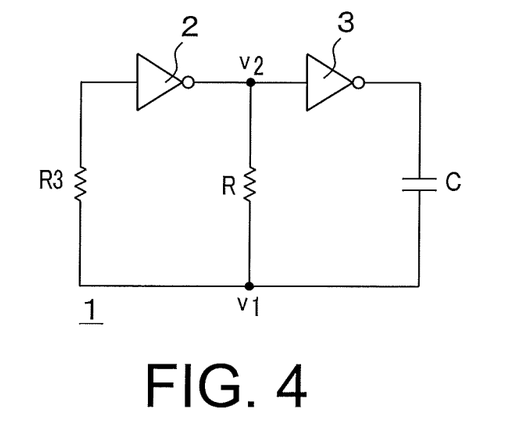
FIG. 4 is a circuit diagram of a CR oscillator according to a first comparative example.

FIG. 4 is a circuit diagram of a CR oscillator 1 according to the first comparative example. The CR oscillator 1 of FIG. 4 is provided with a first logic inversion unit 2 and a second logic inversion unit 3 connected to each other in series, and a resistor R and a capacitor C connected to each other in series between an output node of the first logic inversion unit 2 and an output node of the second logic inversion unit 3. A connection node of the resistor R and the capacitor C is connected to an input node of the first logic inversion unit 2 via a protection resistor R3 that may be omitted.

An input-node electric potential $v_1$ of the first logic inversion unit 2 in the CR oscillator 1 of FIG. 4, which is an electric potential $v_1$ of the connection node of the resistor R and the capacitor C, has an electric potential waveform shown in lower most in FIG. 2. As shown in FIG. 2, the input-node electric potential $v_1$ of the first logic inversion unit 2 has a maximum peak value that is higher than the power-supply electric potential V and has a minimum peak value that is lower than the ground electric potential. An output-node electric potential $v_2$ of the first logic inversion unit 2 in the CR oscillator 1 of FIG. 4 is the same as the output-node electric potential of the first logic inversion unit 2 in the CR oscillator 1 of FIG. 1.

As described above, in the CR oscillator 1 according to the first comparative example shown in FIG. 4, there are two cases in which the input-node electric potential $v_1$ of the first logic inversion unit 2 is higher than the power-supply electric potential and is lower than the ground electric potential. Therefore, it is required to configure the first logic inversion unit 2 with high withstand-voltage circuit components. On the contrary, in the CR oscillator 1 according to the present embodiment shown in FIG. 1, the input-node electric potential $v_1'$ of the first logic inversion unit 2 is equal to or lower than the power-supply electric potential but equal to or higher than the ground electric potential. Therefore, it is not required to configure the first logic inversion unit 2 with high withstand-voltage circuit components. If the first logic inversion unit 2 is configured with the high withstand-voltage circuit components, this causes the reduction in oscillation frequency, and hence, according to the present embodiment, the reduction in the oscillation frequency can be restricted.

Subsequently, the oscillation frequency of the CR oscillator 1 shown in FIG. 1 according to the present embodiment and the range of a ratio X of the above-described resistors R1 and R2 will be explained.

A charge q charged in the capacitor C in the state of FIG. 3A (during the time period from time t0 to t1 in FIG. 2) is expressed by the following expression (1). It is defined in the expression (1) that the capacitor C has capacitance C, the second logic inversion unit 3 in the state of FIG. 3A has an output-node electric potential V, and the connection node of the capacitor C and the resistor R1 has an electric potential $v_1$.

$$q = C(V - v_1) \qquad (1)$$

The charge current i flowing through the capacitor C is expressed by the following expression (2) in which R=R1+R2.

$$i = \frac{v_1}{R} = \frac{dq}{dt} = -C\frac{dv_1}{dt} \qquad (2)$$

When the expression (2) is deformed, the following expression (3) is given.

$$RC\frac{dv_1}{dt} + v_1 = 0 \qquad (3)$$

When $v_1$ is given from the expression (3), the following expression (4) is given.

$$v_1 = \frac{(X+1)V_{th} + (X-1)V}{X} \exp\left(\frac{-t}{RC}\right) \qquad (4)$$

The electric potential $v_1'$ of the intermediate node of the resistors R1 and R2 is expressed by the following expression (5) from the expression (4).

$$v'_1 = \frac{X}{X+1}v_1 = \left\{\left(\frac{X-1}{X+1}\right)V + V_{th}\right\}\exp\left(\frac{-t}{RC}\right) \quad (5)$$

Time $T_1$ taken by the electric potential $v_1'$ of the intermediate node in the expression (5) to decrease to the threshold voltage $V_{th}$ or lower is expressed by the following expression (6).

$$T_1 = RC\ln\left(\frac{\left(\frac{X-1}{X+1}\right)V + V_{th}}{V_{th}}\right) \quad (6)$$

A charge q charged in the capacitor C in the state of FIG. 3B (during the time period from time t1 to t2 in FIG. 2) is expressed by the following expression (7).

$$q = Cv_1 \quad (7)$$

The charge current i flowing through the capacitor C is expressed by the following expression (8).

$$i = \frac{V - v_1}{R} = \frac{dq}{dt} = C\frac{dv_1}{dt} \quad (8)$$

When $v_1$ is given from the expression (8), the following expression (9) is given.

$$v_1 = V - \left(2V - \frac{(X+1)V_{th}}{X}\right)\exp\left(\frac{-t}{RC}\right) \quad (9)$$

The electric potential $v_1'$ of the intermediate node of the resistors R1 and R2 is expressed by the following expression (10) from the expression (9).

$$v'_1 = V - \left(2\left(\frac{X}{X+1}\right)V - V_{th}\right)\exp\left(\frac{-t}{RC}\right) \quad (10)$$

Time $T_2$ taken by the electric potential $v_1'$ of the intermediate node in the expression (10) to exceed the threshold voltage $V_{th}$ is expressed by the following expression (11).

$$T_2 = RC\ln\left(\frac{2\left(\frac{X}{X+1}\right)V - V_{th}}{V - V_{th}}\right) \quad (11)$$

An oscillation frequency $F_{out}$ of the CR oscillator 1 of FIG. 1 is expressed by the following expression (12) using the expressions (6) and (11).

$$F_{out} = \frac{1}{T_1 + T_2} = \frac{1}{RC\ln\left(\frac{\left(\left(\frac{X-1}{X+1}\right)V + V_{th}\right)\left(2\left(\frac{X}{X+1}\right)V - V_{th}\right)}{V_{th}(V - V_{th})}\right)} \quad (12)$$

In contrast, an oscillation frequency $F_{out'}$ of the CR oscillator 1 according to the first comparative example shown in FIG. 4 is expressed by the following expression (13).

$$F'_{out} = \frac{1}{RC\ln\left(\frac{(V + V_{th})(2V - V_{th})}{V_{th}(V - V_{th})}\right)} \quad (13)$$

As understood from the comparison between the expressions (12) and (13), since X>1, the oscillation frequency of the CR oscillator 1 according to the present embodiment shown in the expression (12) is higher than the oscillation frequency of the CR oscillator 1 according to the first comparative example of FIG. 4.

A maximum electric potential $V_{MAX}$ and a minimum electric potential $V_{MIN}$ of the input node of the first logic inversion unit 2, just after that the output logic of the first logic inversion unit 2 is inverted, are expressed by the following expressions (14) and (15), respectively, when t=0 in the expressions (5) and (10).

$$V_{MAX} = \left(\frac{X-1}{X+1}\right)V + V_{th} \quad (14)$$

$$V_{MIN} = -\left(\frac{X-1}{X+1}\right)V + V_{th} \quad (15)$$

By adjusting the ratio X of the resistors R1 and R2, it is achieved that the input-node electric potential of the first logic inversion unit 2 does not exceed the power-supply electric potential V.

In detail, it is a requirement for $V_{MAX}$ in the expression (14) to have $V_{MAX} \leq V$, and the ratio X that meets this condition requires to satisfy the relationship expressed by the following expression (16).

$$X \leq \frac{2V}{V_{th}} - 1 \quad (16)$$

Moreover, it is a requirement for $V_{MIN}$ in the expression (15) to have $V_{MIN} \geq 0$, and the ratio X that meets this condition requires to satisfy the relationship expressed by the following expression (17).

$$X \leq \frac{V + V_{th}}{V - V_{th}} \quad (17)$$

By selecting a ratio X that satisfies both of the relationships expressed by the expressions (16) and (17), the input node voltage of the first logic inversion unit 2 becomes equal to or lower than the power-supply electric potential V but equal to or higher than the ground electric potential 0.

As described above, in the first embodiment, series-connected two or more resistors R1 and R2, and the capacitor C are provided between the output node of the first logic inversion unit 2 and the output node of the second logic inversion unit 3, and the intermediate node between the two or more resistors R1 and R2 is connected to the input node of the first logic inversion unit 2 via or not via the protection resistor R3. Having this circuit connection, the oscillation frequency of the CR oscillator 1 can be set much higher. Moreover, by appropriately adjusting the resistance ratio of the two or more resistors R1 and R2, the input-node electric potential of the first logic inversion unit 2 can be set to a potential between the power-supply electric potential of and the ground electric potential of the first logic inversion unit 2. Therefore, according to the present embodiment, the input-node electric potential of the first logic inversion unit 2 does not exceed the power-supply electric potential, so that it is not necessary to provide high withstand-voltage circuit components for the first logic inversion unit 2, and hence the reduction in oscillation frequency can be prevented.

(Second Embodiment)

In order to increase noise immunity of the CR oscillator 1 according to the first embodiment, it is desirable to configure the first-stage logic inversion element (for example, an inverter) in the first logic inversion unit 2 with a Schmitt inverter.

Figure 5:
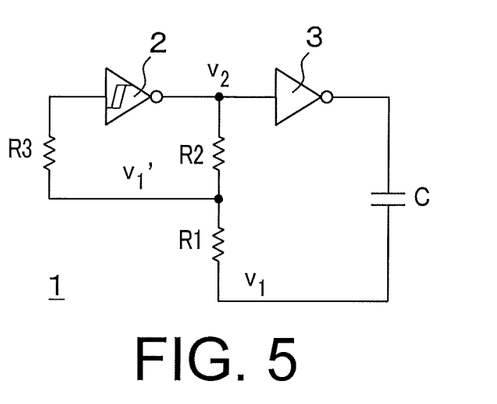
FIG. 5 is a circuit diagram of a CR oscillator according to a second embodiment.

FIG. 5 is a circuit diagram of a CR oscillator 1 according to a second embodiment. The CR oscillator 1 of FIG. 5 has a Schmitt inverter as the first-stage logic inversion element of the first logic inversion unit 2, the other circuit configuration being the same as the CR oscillator 1 of FIG. 1. When the first logic inversion unit 2 is configured with three or more odd-number stages of series-connected logic inversion elements, the first-stage logic inversion element thereamong may be the Schmitt inverter.

For the Schmitt inverter, a threshold voltage $V_{IH}$ at which the output logic is changed from high to low is different from a threshold voltage $V_{IL}$ at which the output logic is changed from low to high, in detail, $V_{IH} > V_{IL}$, $(V_{IH} - V_{IL})$ being referred to as a hysteresis width. Having the different threshold voltages, in the Schmitt inverter, unless its input-node electric potential becomes higher than a threshold voltage $V_{th}$ of a regular inverter, its output-node electric potential does not change from high to low, and unless its input node electric potential becomes lower than the threshold voltage $V_{th}$ of the regular inverter, its output-node electric potential does not change from low to high. Therefore, immunity to noises superimposed on the input node improves.

Figure 6:
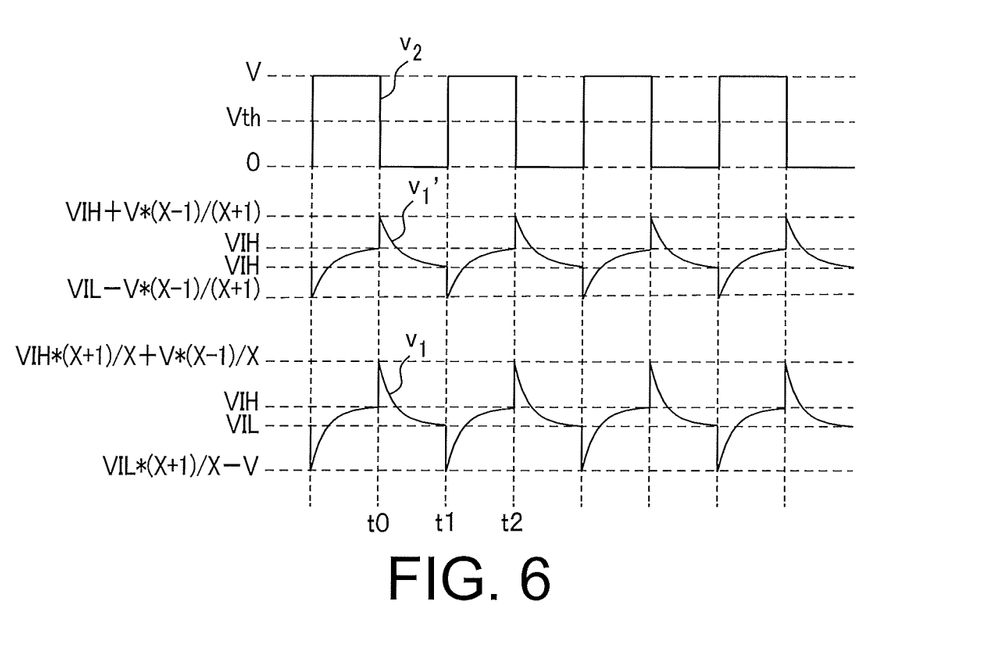
FIG. 6 is an electric-potential waveform diagram at input node and output node of a first logic inversion unit of FIG. 5.

FIG. 6 is an electric-potential waveform diagram at the input and output nodes of the first logic inversion unit 2 of FIG. 5.

Time $T_1'$ taken by an electric potential $v_1'$ of an intermediate node in FIG. 5 from time t0 to t1 in FIG. 6 to be equal to or lower than the threshold level voltage $V_{IL}$ is expressed by the following expression (18).

$$T_1' = RC \ln\left(\frac{\left(\frac{X-1}{X+1}\right)V + V_{IH}}{V_{IL}}\right) \quad (18)$$

Likewise, time $T_2'$ taken by the electric potential $v_1'$ of the intermediate node in FIG. 5 from time t1 to t2 in FIG. 6 to exceed the threshold level voltage $V_{IH}$ is expressed by the following expression (19).

$$T_2' = RC \ln\left(\frac{2\left(\frac{X}{X+1}\right)V - V_{IL}}{V - V_{IH}}\right) \quad (19)$$

Therefore, an oscillation frequency $F_{out}'$ of the CR oscillator 1 of FIG. 5 is expressed by the following expression (20) using the expressions (18) and (19).

$$F_{out}' = \frac{1}{T_1' + T_2'} = \frac{1}{RC \ln\left(\frac{\left(\left(\frac{X-1}{X+1}\right)V + V_{IH}\right)\left(2\left(\frac{X}{X+1}\right)V - V_{IL}\right)}{V_{IL}(V - V_{IH})}\right)} \quad (20)$$

As shown in FIG. 6, an output-node electric potential $v_2$ of the first logic inversion unit 2 is a rectangular-waveform electric potential, like shown in FIG. 2. A connection-node electric potential $v_1$ of the resistor R1 and the capacitor C is higher than the output-node electric potential $v_1'$ of the first logic inversion unit 2.

Figure 7:
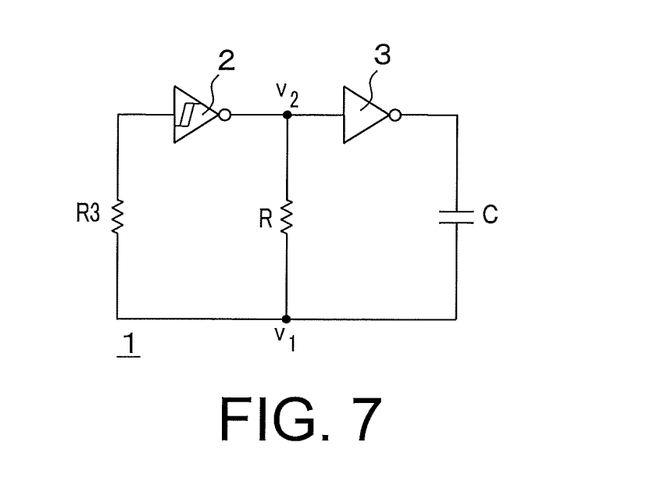
FIG. 7 is a circuit diagram of a CR oscillator according to a second comparative example.

FIG. 7 is a circuit diagram of a CR oscillator 1 according to a second comparative example. The CR oscillator 1 of FIG. 7 is different from the CR oscillator 1 of the first comparative example of FIG. 4 in that a first-stage inverter in a first logic inversion unit 2 is the Schmitt inverter, the other configuration being the same as the CR oscillator 1 of FIG. 4.

An oscillation frequency $F_{out}'$ of the CR oscillator 1 of FIG. 7 is expressed by the following expression (21).

$$F_{out}' = \frac{1}{RC \ln\left(\frac{(V + V_{IH})(2V - V_{IL})}{V_{IL}(V - V_{IH})}\right)} \quad (21)$$

As understood from the comparison between the expressions (20) and (21), since X>1, the oscillation frequency of the CR oscillator 1 according to the present embodiment shown in the expression (20) is higher than the oscillation frequency of the CR oscillator 1 according to the second comparative example of FIG. 7.

A maximum electric potential $V_{MAX}$ and a minimum electric potential $V_{MIN}$ of the input node of the first logic inversion unit 2, just after that the output logic of the first logic inversion unit 2 is inverted, are expressed by the following expressions (22) and (23), respectively.

$$V_{MAX} = \left(\frac{X-1}{X+1}\right)V + V_{IH} \quad (22)$$

$$V_{MIN} = -\left(\frac{X-1}{X+1}\right)V + V_{IL} \quad (23)$$

Also in the second embodiment, by adjusting the ratio X of the resistors R1 and R2, it is achieved that the input-node electric potential of the first logic inversion unit 2 does not exceed the power-supply electric potential V.

In detail, it is a requirement for $V_{MAX}$ in the expression (22) to have $V_{MAX} \leq V$, the ratio X that meets this condition requires to satisfy the relationship expressed by the following expression (24).

$$X \leq \frac{2V}{V_{IH}} - 1 \quad (24)$$

Moreover, it is a requirement for $V_{MIN}$ in the expression (23) to have $V_{MIN} \geq 0$, the ratio X that meets this condition requires to satisfy the relationship expressed by the following expression (25).

$$X \le \frac{V + V_{IL}}{V - V_{IL}} \quad (25)$$

By selecting a ratio X that satisfies both of the relationships expressed by the expressions (24) and (25), the input node voltage of the first logic inversion unit 2 becomes equal to or lower than the power-supply electric potential V but equal to or higher than the ground electric potential 0.

As described above, in the second embodiment, since the first-stage inversion element in the first logic inversion unit 2 is the Schmitt inverter, noise immunity improves. Moreover, in the present embodiment, since the input-node electric potential of the Schmitt inverter is equal to or lower than the power-supply electric potential but equal to or higher than the ground electric potential, the Schmitt inverter is not required to withstand high voltages, so that the reduction in oscillation frequency can be restricted.

(Third Embodiment)

In a third embodiment, whether to perform an oscillating operation is controlled with an enable signal.

Figure 8:
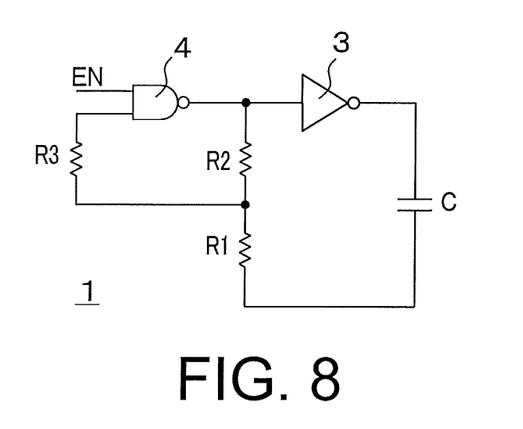
FIG. 8 is a circuit diagram of a CR oscillator according to a third embodiment.

FIG. 8 is a circuit diagram of a CR oscillator 1 according to the third embodiment. In the CR oscillator 1 of FIG. 8, a first logic inversion unit 2 has a different internal configuration from the first logic inversion unit 2 of FIG. 1. The first logic inversion unit 2 of FIG. 8 has a NAND gate (logic inversion element) 4. In addition to the NAND gate 4, even-number stages of logic inversion elements (for example, inverters) may be connected in series. In other words, it is a requirement that the number of logic-inversion element stages including the NAND gate 4 is an odd number.

The NAND gate 4 of FIG. 8 performs a negative AND operation to a signal of an intermediate node of resistors R1 and R2, and an enable signal EN, to output a result of the negative AND operation. When the enable signal EN is high, the NAND gate 4 operates as an inverter, as equivalent circuitry. When the enable signal EN is low, the output signal of the NAND gate 4 is fixed to be low, so that no oscillating operation is performed. Therefore, only when the enable signal EN is high, the CR oscillator 1 performs an oscillating operation.

Figure 9:
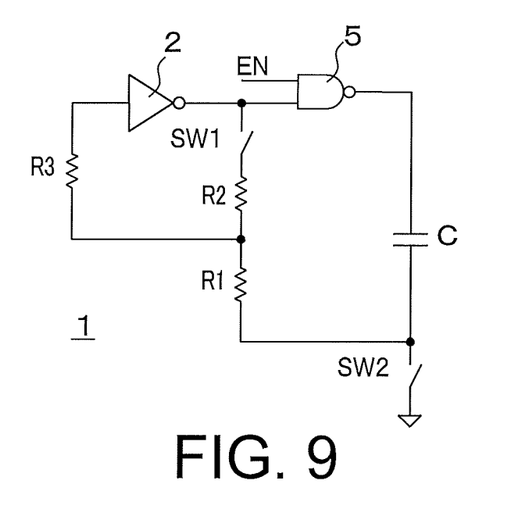
FIG. 9 is a circuit diagram of a CR oscillator according to a modification of the third embodiment.

FIG. 9 is a circuit diagram of a CR oscillator 1 according to a modification of FIG. 8. In the CR oscillator 1 of FIG. 9, a second logic inversion unit 3 has a different internal configuration from the second logic inversion unit 3 of FIG. 1, newly provided with two switches SW1 and SW2. The second logic inversion unit 3 of FIG. 9 has a NAND gate (logic inversion element) 5. In addition to the NAND gate 5, even-number stages of logic inversion elements (for example, inverters) may be connected in series. In other words, it is a requirement that the number of logic-inversion element stages including the NAND gate 5 is an odd number.

While an enable signal EN is high, the NAND gate 5 operates as an inverter, as equivalent circuitry. When the enable signal EN becomes low, the output signal of the NAND gate 5 is fixed to be high.

The switch SW1 is provided between an output node of a first logic inversion unit 2 and one terminal of a resistor R2. Moreover, the switch SW2 is provided between a connection node of a resistor R1 and a capacitor C, and a ground node.

While the enable signal EN is high, the switch SW1 makes the output node of the first logic inversion unit 2 and the one terminal of the resistor R2 conductive. When the enable signal EN becomes low, the switch SW1 breaks the connection between the output node of the first logic inversion unit 2 and the one terminal of the resistor R2.

While the enable signal EN is high, the switch SW2 breaks the connection between the connection node of the resistor R1 and the capacitor C, and the ground node. When the enable signal EN becomes low, the switch SW2 makes the connection node and the ground node conductive.

A reason for providing the switches SW1 and SW2 is to fix the electric potential of each node when the enable signal EN is low. In detail, when the enable signal EN becomes low, a current flows from the NAND gate 5 to the capacitor C to charge the capacitor C, with an electric potential at an intermediate node of the resistors R1 and R2 being fixed to a ground electric potential.

The NAND gates 4 and 5 provided in the CR oscillators 1 of FIGS. 8 and 9, respectively, may be provided in the CR oscillator 1 of the second embodiment.

As described above, in the third embodiment, whether to make the CR oscillator 1 of each of the first and second embodiments perform an oscillating operation can be controlled with the enable signal EN.

The CR oscillators 1 according to the above-described first to third embodiments can be used for a variety of purposes. Especially, the CR oscillators 1 according to the first to third embodiments are in excellent in responsiveness even having a simple circuit configuration, and hence can be used for, for example, generation of a clock signal for reading information of a fuse, a memory, a register, etc., just after power-on.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A CR oscillator comprising:
a first logic inversion unit including odd-number stages of logic inversion elements connected in series;
a second logic inversion unit including odd-number stages of logic inversion elements connected in series, the second logic inversion unit being connected to a latter stage of the first logic inversion unit; and
two or more resistors and a capacitor connected in series between an output node of the first logic inversion unit and an output node of the second logic inversion unit,
wherein an electric potential in accordance with an electric potential of an intermediate node between the two or more resistors is supplied to an input node of the first logic inversion unit,
wherein the two or more resistors comprise a first resistor and a second resistor connected in series between the output node of the first logic inversion unit and one terminal of the capacitor,
the electric potential of the intermediate node is an electric potential of a connection node of the first resistor and the second resistor,
a ratio of a resistance value of the first resistor and a resistance value of the second resistor is set so that an electric potential of the input node of the first logic inversion unit is equal to or lower than a power-supply electric potential of the first logic inversion unit but equal to or higher than a ground electric potential of the first logic inversion unit, and the ratio is set so that expressions (1) and (2) are established, wherein the ratio is X, the power-supply electric potential of the first logic inversion unit and the second logic inversion unit is V, and a threshold voltage of the first logic inversion unit is Vth:

$$X \le \frac{2V}{V_{th}} - 1 \qquad (1)$$

$$X \le \frac{V + V_{th}}{V - V_{th}}. \qquad (2)$$

2. The CR oscillator of claim 1, wherein the output node of the first logic inversion unit is connected to an input node of the second logic inversion unit, and wherein the capacitor, the first resistor, and the second resistor are connected in series between the input node and the output node of the second logic inversion unit.

3. The CR oscillator of claim 1, further comprising a third resistor connected between the intermediate node and the input node of the first logic inversion unit.

4. A CR oscillator comprising:

a first logic inversion unit including odd-number stages of logic inversion elements connected in series;

a second logic inversion unit including odd-number stages of logic inversion elements connected in series, the second logic inversion unit being connected to a latter stage of the first logic inversion unit; and two or more resistors and a capacitor connected in series between an output node of the first logic inversion unit and an output node of the second logic inversion unit, wherein an electric potential in accordance with an electric potential of an intermediate node between the two or more resistors is supplied to an input node of the first logic inversion unit, and wherein an oscillation frequency is expressed by an expression (3), where a ratio is X, a power-supply electric potential of the first logic inversion unit and the second logic inversion unit is V, a threshold voltage of the first logic inversion unit is Vth, a combined resistance value of a first resistor and a second resistor is R, and a capacitance of the capacitor is C $$F_{out} = \frac{1}{RC\ln\left(\frac{\left(\left(\frac{X-1}{X+1}\right)V + V_{th}\right)\left(2\left(\frac{X}{X+1}\right)V - V_{th}\right)}{V_{th}(V - V_{th})}\right)}. \qquad (3)$$

5. The CR oscillator of claim 1, wherein the electric potential of the intermediate node is equal to or lower than the power-supply electric potential of the first logic inversion unit but equal to or higher than the ground electric potential of the first logic inversion unit.

6. The CR oscillator of claim 1, wherein a first-stage logic inversion element, among the odd-number stages of logic inversion elements in the first logic inversion unit, is a Schmitt inverter.

7. The CR oscillator of claim 6, wherein the two or more resistors comprise the first resistor and the second resistor connected in series between the output node of the first logic inversion unit and one terminal of the capacitor, and wherein the electric potential of the intermediate node is the electric potential of the connection node of the first resistor and the second resistor.

8. The CR oscillator of claim 7, wherein an oscillation frequency is expressed by an expression (4), wherein a ratio of a resistance value of the first resistor and a resistance value of the second resistor is X, the power-supply electric potential of the first logic inversion unit and a power-supply electric potential of the second logic inversion unit is V, a threshold voltage when an output logic of the Schmitt inverter switches from a high level to a low level is VIH, a threshold voltage when the output logic of the Schmitt inverter switches from the low level to the high level is VIL, a combined resistance value of the first resistor and the second resistor is R, and a capacitance of the capacitor is C $$F_{out} = \frac{1}{RC\ln\left(\frac{\left(\left(\frac{X-1}{X+1}\right)V + V_{IH}\right)\left(2\left(\frac{X}{X+1}\right)V - V_{IL}\right)}{V_{IL}(V - V_{IH})}\right)}. \qquad (4)$$

9. The CR oscillator of claim 1, wherein at least one of the first logic inversion unit and the second logic inversion unit comprises a logic inversion element to switch whether or not to perform an oscillation operation.

10. The CR oscillator of claim 9, wherein the logic inversion element comprises an input terminal to which a control signal is input, and wherein the logic inversion element switches whether or not to perform in the oscillation operation based on logic of the control signal.

* * * * *